(12) United States Patent
Mukainakano

(10) Patent No.: US 6,198,252 B1
(45) Date of Patent: Mar. 6, 2001

(54) BATTERY STATE MONITORING CIRCUIT AND BATTERY DEVICE

(75) Inventor: Hiroshi Mukainakano, Chiba (JP)

(73) Assignee: Seiko Instruments Inc. (JP)

( * ) Notice: Subject to any disclaimer, the term of this patent is extended or adjusted under 35 U.S.C. 154(b) by 0 days.

(21) Appl. No.: 09/317,581

(22) Filed: May 24, 1999

(30) Foreign Application Priority Data

May 25, 1998 (JP) .................................................. 10-143394

(51) Int. Cl.[7] ...................................................... H02J 7/04
(52) U.S. Cl. .............................................. 320/128; 320/127
(58) Field of Search ..................................... 320/128, 127, 320/112, 113, 116, 117, 136

(56) References Cited

U.S. PATENT DOCUMENTS

| 5,764,028 | * | 1/1998 | Freiman et al. ...................... 320/106 |
| 5,796,238 | * | 8/1998 | Hiratsuka et al. .................... 320/112 |
| 5,890,780 | * | 4/1999 | Tomiyori .............................. 320/132 |

* cited by examiner

Primary Examiner—Peter S. Wong
Assistant Examiner—Lawrence Luk
(74) Attorney, Agent, or Firm—Adams & Wilks

(57) ABSTRACT

In a battery state monitoring circuit including a voltage regulator therein and capable of controlling an internal circuit with a signal from a microcomputer, a circuit is provided in which the control of the internal circuit is available with the signal from the microcomputer in the case where the output of the voltage regulator is normal, and the signal of the internal circuit is decided regardless of the signal from the microcomputer in the case where the output of the voltage regulator is floating or in GND level.

11 Claims, 5 Drawing Sheets

BATTERY STATE MONITORING CIRCUIT AND BATTERY DEVICE

BACKGROUND OF THE INVENTION

The present invention relates to a battery device (hereinafter, referred to as "battery pack") including a circuit required to be monitored for a battery state such as a voltage or a charge/discharge current, a battery state monitoring circuit for monitoring the circuit, an external connection terminal outside of the battery device, a switch element, a secondary battery and a sense resistor in a battery device for a secondary battery.

As a conventional battery pack, there has been known a device shown in a circuit block diagram of FIG. 2. For example, Japanese unexamined patent application publication No. H 9-312172 (1997) entitled "Battery pack, charger and charging system as well as charging method" discloses the structure of this type. This is directed to a battery pack which is commonly called a "smart battery system" or the like. That is, a battery pack 120 is structured by a battery state monitoring circuit 18A, a switch element 102a and 102b, a sense resistor 10, a cut out circuit 19 and secondary batteries 6 to 8. The battery state monitoring circuit 18A is structured by a microcomputer 4A, a battery voltage monitoring circuit 20A and an amplifier 3, and has a function of monitoring a voltage and the charge/discharge current of the secondary battery. Such a battery pack 120 can conduct communication with a charger 17, external equipment such as a microcomputer 5, or with a load 16.

Employing the battery pack 120 thus structured, it is possible to recognize a battery state by communication with the charger 17, the microcomputer 5 within a personal computer, a load 16 or the like. The use of this information allows an indication of the residual amount of the battery, a suspension of battery charge, etc., to be conducted accurately.

In the case where a lithium ion battery is used for the secondary battery, since a self-protecting action is not provided unlike a nickel cadmium battery, an over-charge protecting circuit is required. That is, the lithium ion battery is provided with some circuit for detection of a battery voltage and a switch element 102a and 102b for suspending charging operation from outside.

SUMMARY OF THE INVENTION

In the battery pack structured as shown in FIG. 2, a microcomputer 4A is used. The battery pack is also equipped with an amplifier for monitoring the voltage of the secondary batteries 6 to 8 and a sense resistor 10 and an amplifier 3 for monitoring a charge/discharge current. The microcomputer 4A is supplied with electric signals from a battery voltage monitor circuit 20A and an amplifier. Since the microcomputer 4A has a calculating function and an A/D converter it can calculate the voltage and the capacity of the secondary battery from the above-described signals, and it can monitor a battery state. This makes it possible for the microcomputer 4A to control the on/off state of the switch element 102a and 102b, and therefore the microcomputer 4A adds safety with respect to over-charging in the battery pack 9A in which lithium ion batteries 6 to 8 maybe used.

It is necessary that a constant voltage is supplied as a power supply of the microcomputer 4A which is a structurally important part. For example, a voltage of 3.3 V or 5.0 V is a normal value. It the supply voltage applied to the microcomputer 4A is unstable, the detection accuracy of the battery voltage, etc., is degraded. In the worst case, there generally occurs a phenomenon called "runaway" of the microcomputer 4A. This is an environment in which the microcomputer 4A is not controlled at all, with the result that the safety of the battery pack 120 is not assured at all.

Because the power supply for the battery state monitoring circuit 18A within the battery pack 120 is made up of a secondary battery 6 to 8, the voltage is varied according to the state of the battery. In the case where the battery pack 120 is discharged to the load 16, the supply voltage becomes low, whereas in the case where the battery pack 120 is charged, the supply voltage becomes high. In order to apply a constant voltage to the microcomputer 4A and the amplifier 3 equipped within the battery pack 120, a voltage regulator is disposed within the battery pack 120. The voltage regulator serves to maintain its output voltage constant even if the supply voltage is varied.

However, if the voltage regulator is disposed in this manner, the battery voltage as the power supply becomes low if the discharging continues. The potential of the secondary battery 6 to 8 is a supply voltage of the voltage regulator, therefore, as the supply voltage of the voltage regulator becomes lower, the output voltage naturally becomes lower. In this state, the supply voltage required for the stable operation of the microcomputer 4A cannot be applied.

Further, to monitor the residual amount of the battery, charge/discharge current to the secondary battery 6 to 8 must be monitored. Therefore, an amplifier 3 for adjusting the voltage drop of sense resistor 10 to a level which can be read by the microcomputer 4A is needed. The amplifier 3 applies a voltage to an A/D port of the microcomputer 4A after amplifying the voltage between the sense resistor 10 terminals through which the charge/discharge current flows. The amplifier 3 is supplied with a high voltage so as to widen the operation voltage range.

The amplifier 3 is not always required to output. This is because the microcomputer 4A is not always reading the output from the amplifier 3. Since the secondary battery 6 to 8 is used for the power supply of the amplifier 3, if the amplifier 3 is normally operated, consumption of the secondary battery 6 to 8 is increased. To improve this, it must be configured such that the consumption current of the amplifier 3 is suppressed by the microcomputer 4A.

As described above, since the supply voltage of the microcomputer 4A is supplied from the voltage regulator, the maximum voltage of the signal output from the microcomputer 4A is lower than the voltage of the secondary battery 6 to 8, and is identical with the output voltage of the voltage regulator. To obtain such a circuit structure in which an amplifier 3 suppresses the consumption current by a signal of the microcomputer 4A, a control circuit which converts a low voltage signal of the microcomputer 4A to a high voltage signal must be equipped. The power supply of the control circuit is in high voltage level.

However, in the thus structured battery state monitoring circuit 18A, it is impossible to obtain a structure to suppress the consumption current of the amplifier 3. When the voltage of the secondary battery 6 to 8 lowers and the output of the voltage regulator within the battery state monitoring circuit 18A is suspended, the output of the microcomputer 4A becomes unstable to cause the input voltage of the control circuit to become unstable. Therefore, the output signal of the control circuit also becomes unstable.

In such a state, the consumption current of the battery state monitoring circuit 18A can not be suppressed; therefore, consumption current from the secondary battery 6 to 8 is increased and the life of the battery pack is shortened. Further, the signal of the amplifier 3 becomes unstable. In the above circumstances, the state monitoring of the secondary battery 6 to 8 can not be conducted accurately and the safety of the battery pack 120 is impaired.

In order to solve the above problems, according to the present invention, in a battery state monitoring circuit including a voltage regulator therein and being capable of controlling an internal circuit with a signal from a microcomputer, a circuit is provided in which the control of the internal circuit is available by the signal from the microcomputer in the case where the output of the voltage regulator is normal, and the signal of the internal circuit is decided regardless of the signal from the microcomputer in the case where the output of the voltage regulator is floating or at GND level.

In a battery state monitoring circuit including a voltage regulator therein and being capable of controlling an internal circuit with a signal from a microcomputer by supplying the power supply to the microcomputer, the device is structured such that the internal control circuit is controlled by a signal of a circuit that does not use the output of the voltage regulator as a power supply in the case where the voltage is not output from the voltage regulator.

With this structure, the stability of the control signal of the internal control circuit is maintained even in the case where the voltage of the regulator is not output. Further, in the case where the output of the regulator is normal, since the control of each block by the signal from the microcomputer can be conducted, the safety of the battery pack is enhanced, and due to the suppression of the current consumption of the secondary battery, the battery state is monitored for a long period, thereby being capable of obtaining high-quality information from the battery pack.

DESCRIPTION OF THE PREFERRED EMBODIMENTS

Figure 1:
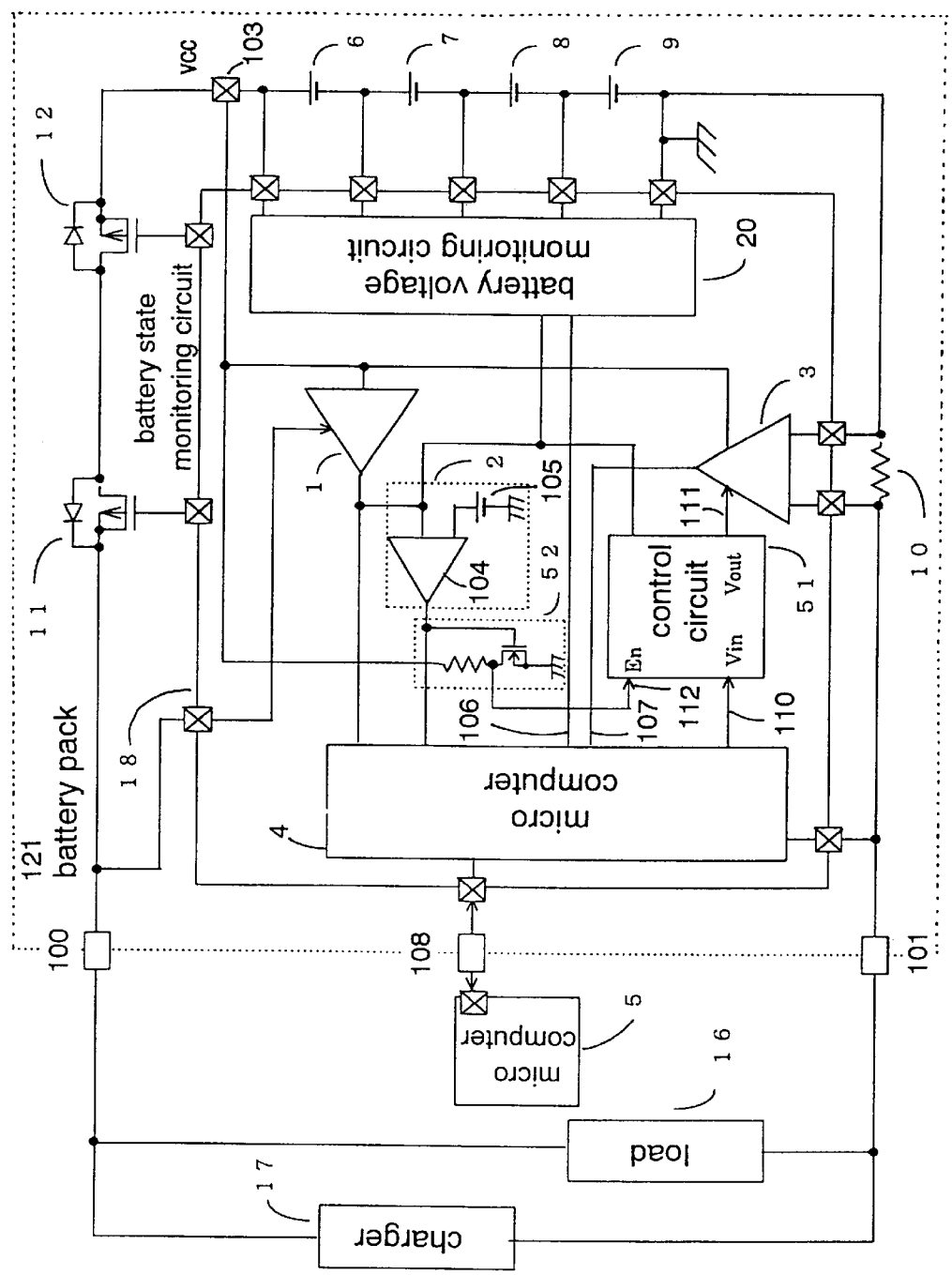
FIG. 1 is a block diagram showing one embodiment of a battery state monitoring circuit in accordance with the present invention and a battery pack using the same.
Figure 2:
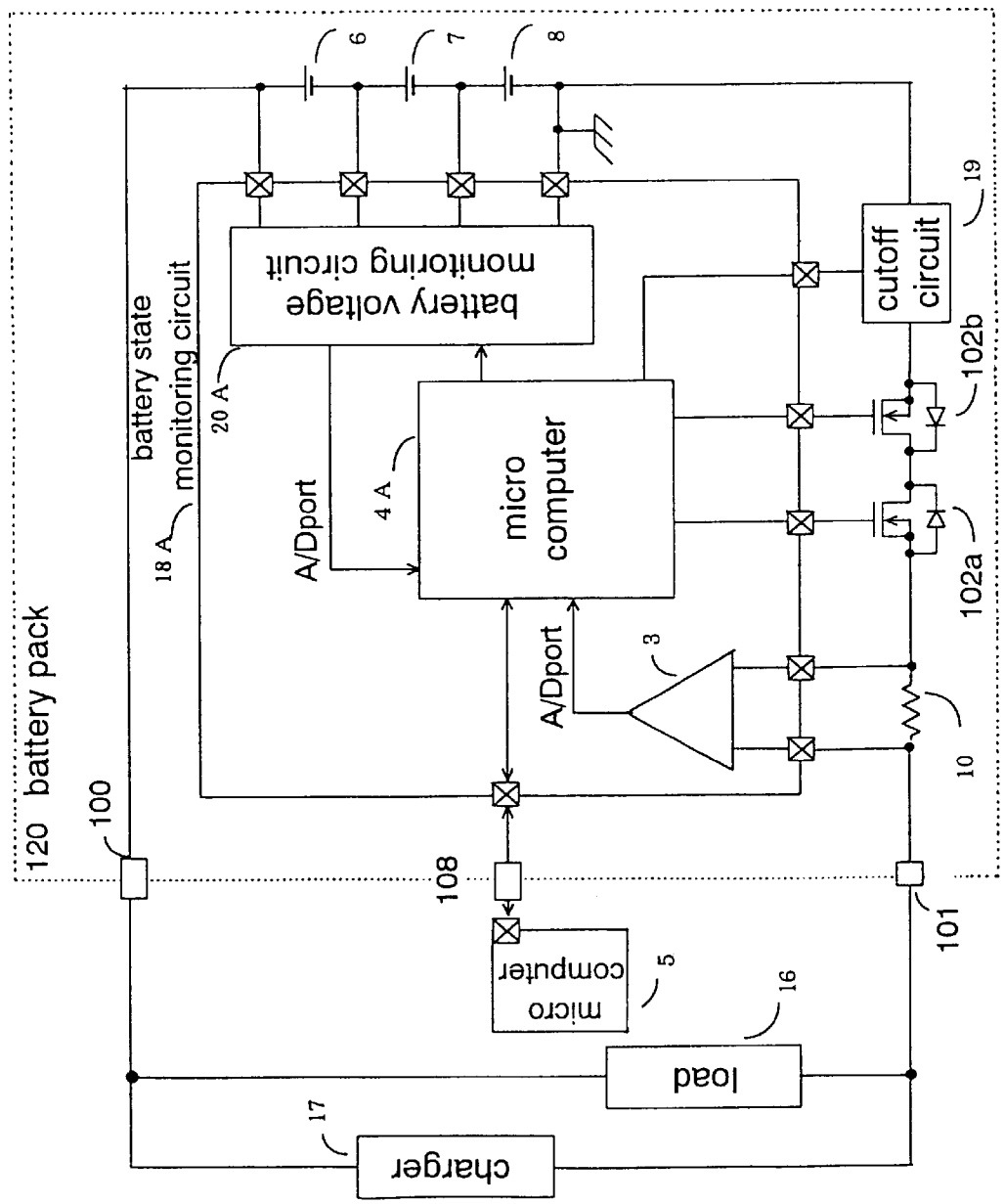
FIG. 2 is a block diagram showing a conventional battery state monitoring circuit and a battery pack using the same.

FIG. 1 shows a battery state monitoring circuit to which the present invention is applied, and a structural example of a battery pack using the same. Hereinafter, an embodiment of the present invention will be described with reference to FIG. 1.

The battery pack 121 is designed such that a plurality of secondary batteries (for example, cells of a lithium ion battery) are connected in series. In the example of FIG. 1, four secondary batteries 6, 7, 8 and 9 are connected in series. A negative pole of the secondary battery 9 is connected to a sense resistor 10. Further, the sense resistor 10 is connected to minus terminal 101 or the battery pack 121. A positive pole of the secondary battery 6 is connected to a switch element 12 made up of an FET and the like. The switch element 12 and a switch element 11 are connected in series, and the switch element 11 is connected in series to a plus terminal 100 of the battery pack 121. The switch elements 11 and 12 are used as switch elements for controlling discharge from the battery pack 121 and the charging to the battery pack from a charger. When charging of the battery pack 121 is inhibited, the switch element 11 may be turned off. Also, when discharge from the battery pack is inhibited, the switch element 12 may be turned off. The switch elements may alternatively be connected between the negative pole of the secondary battery 9 and a sense resistor 10. In this case, it is necessary that the type of FETs, etc., is appropriately changed according to the structure. Likewise, the sense resistor 10 may be connected to the plus terminal 100 side of the battery pack 121.

However, in a battery state monitoring circuit 18 thus structured, it is necessary to control consumption current from a microcomputer 4 to an amplifier 3, etc. Because, the consumption of the current of the secondary battery 6 to 9 per se must be suppressed as much as possible to enable use for a long time period, since a power supply of these circuits is derived from the secondary battery 6 to 9. To enable use for a long time period, preferably a circuit can suppress the current consumption of the amplifier 3 with a signal from the microcomputer 4.

The supply voltage of the microcomputer 4 is applied from a voltage regulator 1. The voltage regulator 1 is provided to maintain the output voltage constant even when the supply voltage changes. In the embodiment of FIG. 1, the power supply of the voltage regulator 1 is supplied from a VCC terminal 102 connected to the total voltage of the secondary batteries 6 to 9 connected is series. When a total battery voltage becomes lower than the regulated voltage of the voltage regulator 1, the output voltage of the voltage regulator 1 also lowers.

In this state, the supply voltage required for the stable operation of the microcomputer 4 can not be applied. A voltage detecting circuit 2 is provided to prevent runaway of the microcomputer 4 when the supply voltage of the microcomputer 4 becomes low. The voltage detecting circuit consists of, for example, a comparator 104 and an a reference voltage 105, and output voltage thereof changes when an input voltage becomes a certain set voltage. In FIG. 1, when the output voltage of the voltage regulator 1 lowers, the output of the voltage detecting circuit 2 changes. The microcomputer 4 can prevent malfunctions in advance by suspending its calculating function when this output change takes place. Generally, such control method is called "reset". At this time, the supply of power is useless because the microcomputer 4 is not functioning. In case of this, a circuit is required in which voltage regulator 1 does not consume the current to suppress the overall consumption current and also to suppress the charge consumption of the secondary battery.

The secondary batteries 6 to 9, the switch elements 11, 12, and a sense register 10 are also connected to the battery state monitoring circuit 18, respectively. The battery state monitoring circuit 18 is made up of the microcomputer 4, a battery voltage monitoring circuit 20, the amplifier 3, the voltage regulator 1, and the voltage detecting circuit 2. The power supply of the battery voltage monitoring circuit 20, the voltage detecting circuit 2, etc., is applied from the voltage regulator 1. The power supply of the voltage regulator 1, the amplifier 3, etc. is applied the voltage from the VCC terminal 103.

The battery voltage monitoring circuit 20 is a circuit consisting of, for example, a multiplexer and an amplifier, which transforms the respective voltages of the secondary batteries 6 to 9 to voltages readable by the microcomputer 4 and applies them to an A/D port 106. In the embodiment of FIG. 1, the battery voltage monitoring circuit 20 is formed of a circuit in which the respective voltages of the secondary batteries 6 to 9 are sequentially output to one signal line. The power supply of the battery voltage monitoring circuit 20 is applied from the voltage regulator 1. The circuit is arranged in such a manner that even if the voltage of the secondary battery 6 to 9 is low, the battery voltage monitoring circuit 20 normally operates immediately after the charger 17 is connected to the battery pack 121.

The amplifier 3 is designed to adjust a voltage drop occurring in the sense resistor 10 to a level readable by the microcomputer 4. Since the resistance value of the sense resistor 10 is generally small to the degree of several tens of mΩ, the amplifier 3 amplifies the voltage between the sense resistor 10 terminals and supplies the amplified voltage to the A/D port 107 of the microcomputer 4.

The microcomputer 4 has A/D conversion and calculation functions, etc., and also communicates with the outside of the battery pack 121. The AD port 106 and 107 of the microcomputer 4 are supplied with signals from the amplifier 3 and the battery voltage monitoring circuit 20. In the case where the secondary battery 6 to 9 is formed of a lithium ion battery, there is a fear that ignition would occur, or the like when the battery voltage value becomes higher than a prescribed limit. That is, it is necessary to monitor the battery voltage and suspend charging of the battery pack 121. In this case, the microcomputer 4 controls on/off operation of the switch elements 11 and 12 in accordance with the voltage of the secondary battery 6 to 9. Also, the charge/discharge current of the secondary battery 6 to 9 can be calculated by monitoring the voltage drop across the sense resistor 10. Since the charge/discharge current can be calculated, the capacity of the battery pack 121 can be found.

In the battery state monitoring circuit 18 thus structured, since the power supply is formed of the secondary battery, it is necessary to suppress the consumption current as much as possible to elongate the operation time. It is an effective method to shut out of the current of unnecessary circuits in accordance with the decision of the microcomputer 4 to suppress the consumption current, while obtaining secondary battery information by operating necessary functions. For example, when the microcomputer 4 monitors the secondary battery voltage, the charge/discharge current can not be monitored, so that the amplifier 3 need not be operated.

In order to conduct current control of the amplifier 3, the signal from the microcomputer 4 is input to the amplifier 3. Since the supply voltage of the microcomputer 4 is applied from the voltage regulator 1, the voltage of the signal outputted from the microcomputer 4 is equal to the output voltage of the voltage regulator 1. In order to obtain a circuit structure such that the amplifier 3 suppresses the consumption current with the signal of the microcomputer 4, a control circuit 51 that converts the low voltage signal of the microcomputer 5 to the VCC terminal 103 voltage must be provided. The power supply of the control circuit 51 is the VCC terminal 103 voltage.

Figure 4:
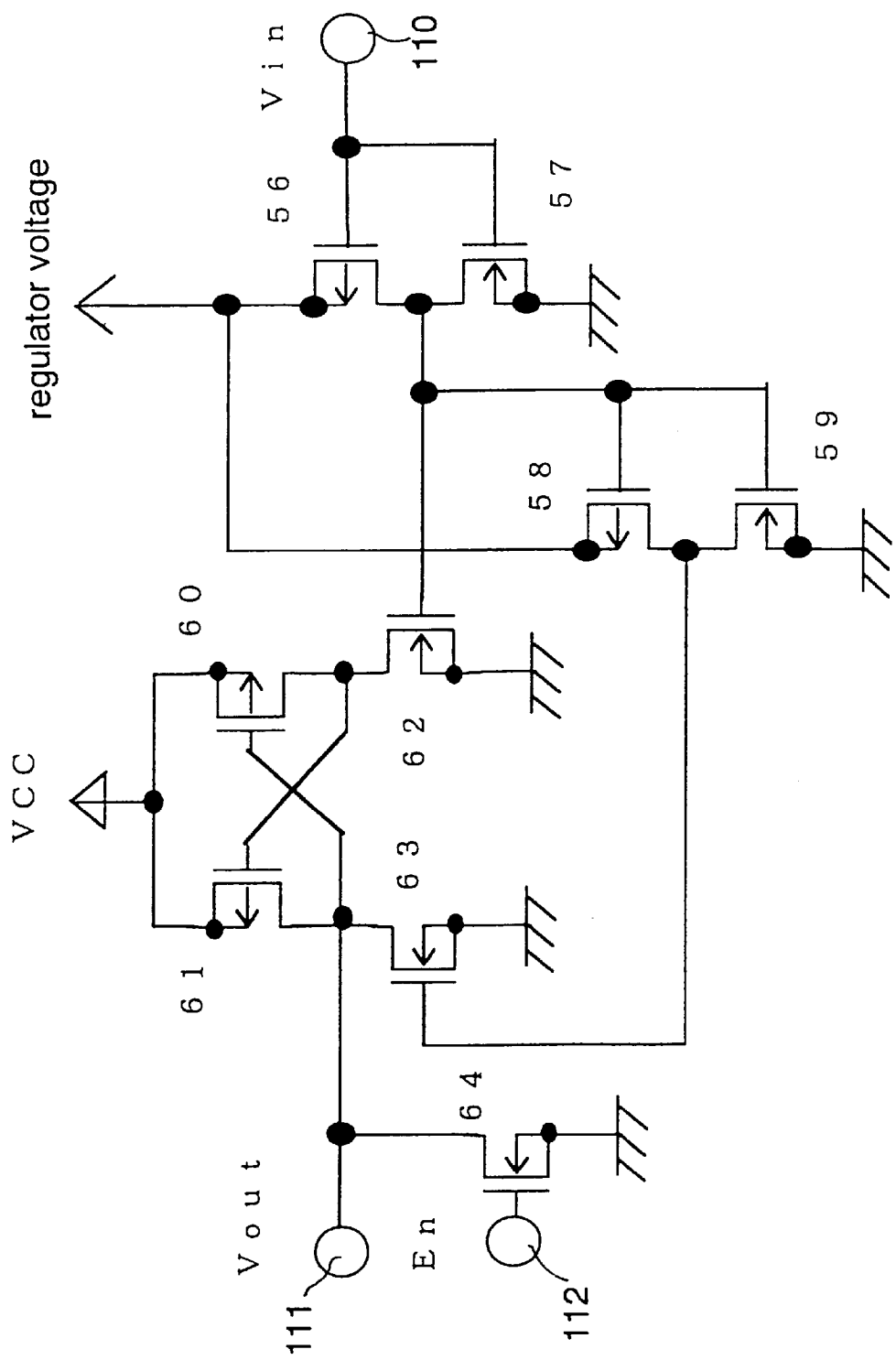
FIG. 4 is one embodiment of a level shift circuit that is used in a battery state monitoring circuit in accordance with the present invention and a battery pack using the same.

An embodiment of the control circuit 51 is shown in FIG. 4. An input terminal 110 is shown by Vin, and an output terminal 111 is shown by Vout. The supply voltage of the transistors 56 to 59 are lower than the supply voltage of the transistors 60 to 63. The En terminal 112 voltage (the gate voltage of the transistor 64) is used to explain the operation of the circuit as a GND potential. In the case where this circuit is employed, large voltage amplification can be obtained from the output even if low voltage amplification is inputted, so that a logic circuit is readily designed in the case where there are two power supplies. In the case of the present embodiment, when the signal of the microcomputer 5 which uses the output voltage of the voltage regulator 1 as a power supply is inputted, the output voltage amplification of the control circuit 51 becomes equal to the VCC terminal 103 voltage.

When the En terminal 112 voltage is in High and the transistor 64 is turned on, the output voltage of the control circuit 51 forcibly becomes in GND level. When the supply voltage of the transistors 56 to 59 are shut out, if the En terminal 112 voltage is in High, the transistor 64 operates and the output voltage of the control circuit 51 forcibly becomes in GND level.

In Embodiment 1 of FIG. 1, the VCC terminal 103 voltage (high supply voltage) and the output of the voltage regulator 1 (low supply voltage) are used for the supply voltage of the control circuit 51. The signal is inputted from the microcomputer 4 to the control circuit 51, and the output of the control circuit 51 is connected to the amplifier 3 and the voltage regulator 1. The En terminal 112 is inputted signals of the voltage detecting circuit 2 via an inverter 52.

Figure 5:
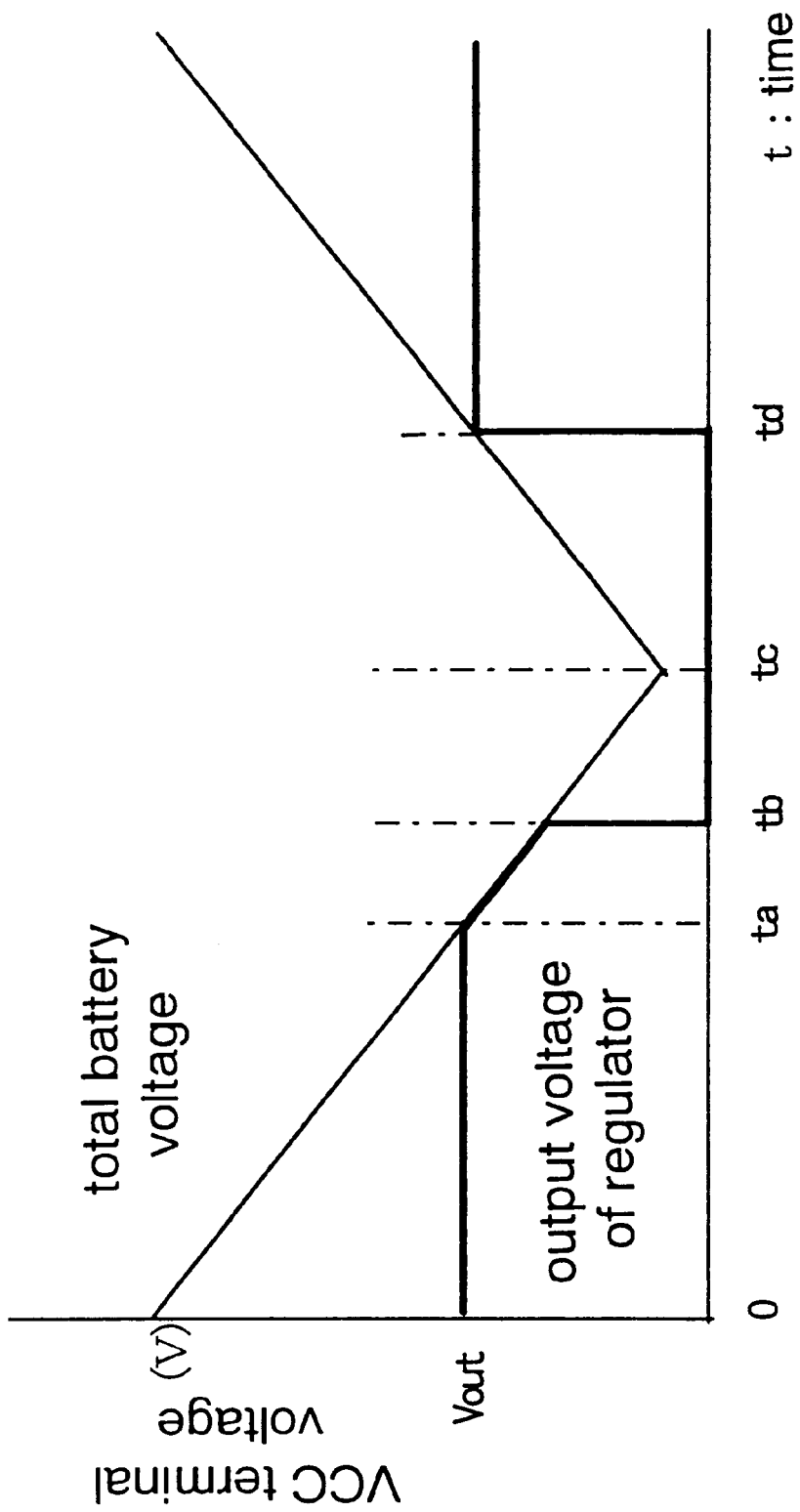
FIG. 5 is a timing chart of one embodiment of the battery state monitoring circuit in accordance with the present invention and a battery pack using same.

Subsequently, operation of the present embodiment will be described with reference to FIG. 5. In the figure, the axis of abscissas represents a time, whereas the axis of ordinates represents a voltage, and the VCC terminal 103 voltage and the supply voltage of the microcomputer 4 are shown. During a period of a time 0 to a time ta, a current is supplied to a load from a battery pack, and the VCC terminal 103 voltage drops as time elapses. At the time ta, the VCC terminal 103 voltage becomes equal to the output voltage of the voltage regulator 1. In a period until a time tb, the control from the microcomputer 4 to the amplifier 3 is conducted with no problem. It is because the supply voltage of the control circuit 51 is ensured.

However, when it reaches to the time tb, the output voltage of the voltage regulator 1 reaches the detection voltage of the voltage detecting circuit 2. The voltage detecting circuit 2 operates to reset the microcomputer 4. In this case, since the microcomputer 4 has already suspended the function, it is unnecessary to supply the power supply. In FIG. 5, at a moment of the time tb, the output voltage of the voltage regulator 1 becomes the GND potential. According to this, since the low supply voltage of the control circuit 51 is in GND level, the input from the microcomputer 4 is not decided. In the present invention, the output of the control circuit 51 is prevented from being unstable. The output of the control circuit 51 is the voltage to be applied to the En terminal 112, in the case of FIG. 1, the output from the voltage detecting circuit 2 is a signal inputted via the inverter 52. For this, the output of the control circuit 51 is stable, and even if the supply voltage of the microcomputer 4 is not inputted, the current consumption of the amplifier 3 and the voltage regulator 1 can be suppressed.

After the time tb, although the consumption current of the battery state monitoring circuit 18 reduces, the VCC terminal 103 voltage lowers due to the self-discharging of the secondary battery 6 to 9. At the time tc, the current supply from the battery pack 121 to the load is suspended and the charger is connected. The secondary battery 6 to 9 is charged and the voltage of the charger 17 becomes higher than the output voltage set at the voltage regulator 1. This is a time td, and the voltage regulator 1 supplies the power supply to the microcomputer 4.

Figure 3:
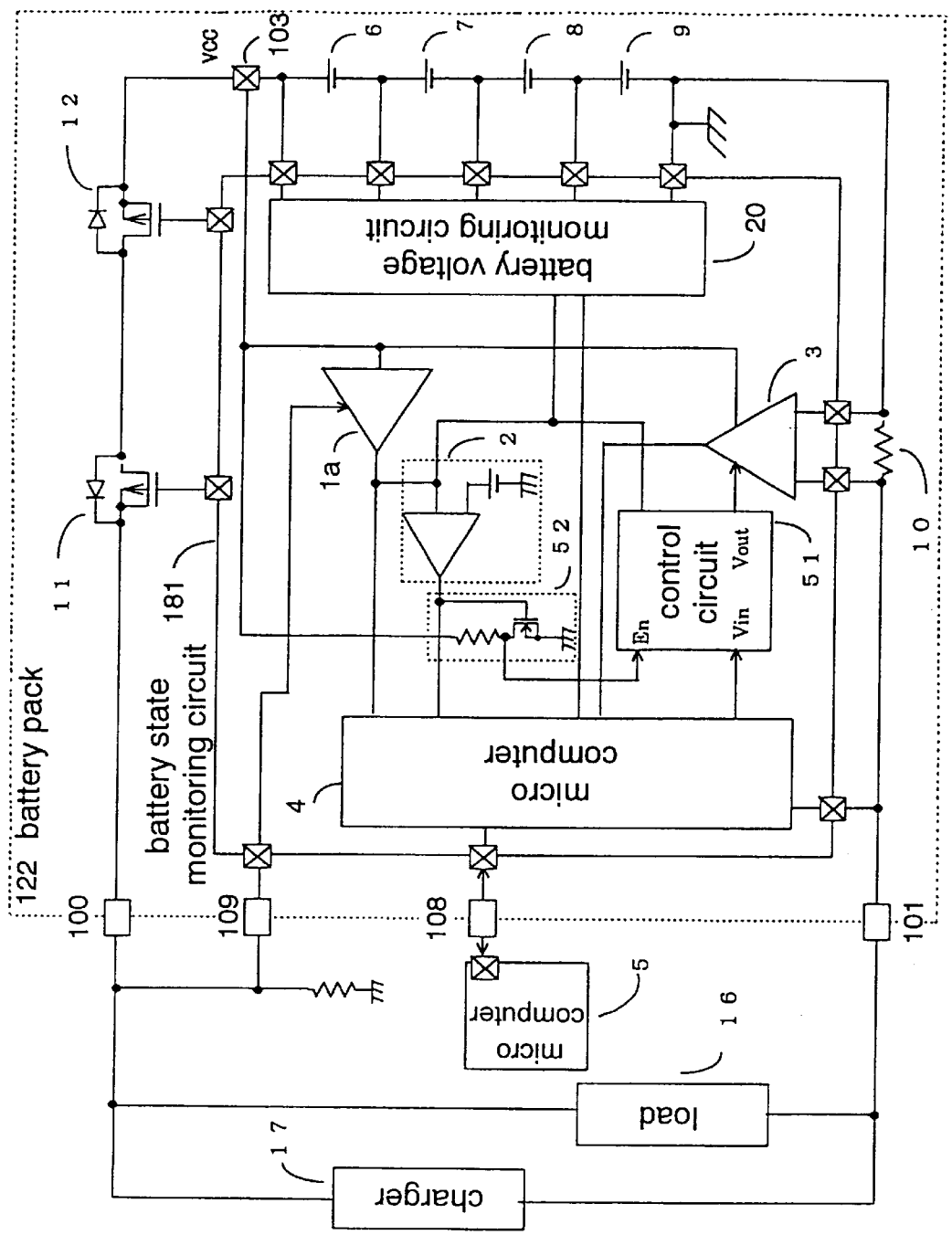
FIG. 3 is a block diagram showing another embodiment of a battery state monitoring circuit in accordance with the present invention and a battery pack using the same.

FIG. 3 shows another embodiment. In this embodiment, the output voltage control of the voltage regulator 1a is enabled from outside of the battery state monitoring circuit 181. Also, in the present embodiment, the output voltage of the control circuit 51 is stable even though the low supply voltage of the control circuit 51 is shut out unexpectedly and the current consumption function of the amplifier 3 operates normally. The present invention is effective even if the voltage regulator 1a is thus controlled from the outside.

In the embodiment described above, the microcomputer 4 and the battery state monitoring circuit 18 are structured as different parts. The structural elements and the operation principles are entirely identical with those in the embodiment described with reference to FIG. 1. In this way, the battery pack according to the present invention is effective even if all of functions are provided in one part (IC), and the same effect is obtained even if a plurality of parts are provided by mounting the microcomputer 4, the switch elements 11, 12, etc., on a substrate.

In the embodiments shown in FIGS. 1 and 3, the structural examples in which the respective secondary batteries are not connected in parallel are described. However, the present invention is similarly applicable to a case in which charge/discharge control is made to the structure where a plurality of secondary batteries are connected in parallel.

According to the present invention, only with an addition of a simple circuit as described above, the control signal of the internal circuit is maintained stable even in the case where the voltage of the regulator is not outputted, the safety of the battery pack is enhanced such that the control to the respective blocks can be conducted from the microcomputer with the signal in the case where the output voltage of the regulator is normal, and the battery state is monitored for a long time period by suppressing charge consumption of the battery. For this, the battery state monitoring is accurately conducted, thereby obtaining information high in quality from the battery pack.

Therefore, a constant voltage can be surely applied to the microcomputer, and since runaway can be prevented to widen the operation range of the microcomputer, the safety of the battery pack is enhance, and the battery state monitoring is accurately conducted, thereby being capable of obtaining information high in quality.

What is claimed is:

1. A battery state monitoring circuit for controlling the charge/discharge state of a secondary battery by controlling the on/off state of a switch element, and for monitoring a voltage and a discharge current of the secondary battery, comprising:
    at least one switch element for controlling the charging and discharging of the secondary battery;
    a sense resistor connected to a terminal of the secondary battery;
    an amplifier for amplifying a voltage across the sense resistor;
    a microcomputer for controlling the on/off state of the at least one switch element in accordance with a voltage or a current of the secondary battery, calculating a charge or discharge current of the secondary battery by monitoring the voltage across the sense resistor, and shutting off the amplifier when monitoring the voltage of the secondary battery;
    a voltage regulator for regulating a voltage of the secondary battery and supplying a regulated voltage to the microcomputer;
    a voltage detecting circuit for detecting the regulated voltage output by the voltage regulator and outputting a signal indicating if the regulated voltage falls below a predetermined voltage level for suspending a calculating function of the microcomputer; and
    a control circuit for maintaining the amplifier in a non-operational state by outputting a ground level voltage to the amplifier when the voltage detecting circuit detects a voltage lower than the predetermined voltage level.

2. A battery device for controlling the charge/discharge state of a secondary battery connected in series to external terminals consisting of a positive terminal and a negative terminal of the battery device through a switch element by controlling the on/off state of the switch element, and for monitoring a voltage and a charge/discharge current of the secondary battery comprising: at least one switch element for controlling the charging and discharging of the secondary battery; a battery state monitoring circuit for monitoring a state of the secondary battery; a microcomputer for calculating a condition of the secondary battery in accordance with an output of the battery state monitoring circuit, and controlling the on/off state of the at least one switch element in accordance with an output of the battery state monitoring circuit and the calculated condition of the secondary battery; a voltage regulator for regulating a voltage of the secondary battery and supplying a regulated voltage to the microcomputer; a voltage detecting circuit for detecting the regulated voltage output by the voltage regulator and outputting a signal indicating if the regulated voltage falls below a predetermined voltage level for suspending a calculating function of the microcomputer; and a control circuit for maintaining the battery state monitoring circuit in a non-operational state by outputting a ground level voltage as a supply voltage to the battery state monitoring circuit when the voltage detecting circuit detects a voltage lower than the predetermined voltage level.

3. A battery state monitoring circuit comprising:
    a current control element for controlling at least one of a charge current and a discharge current of a secondary battery;
    a current detecting circuit for detecting at least one of the charge current and discharge current of the secondary battery;
    a first control circuit for controlling the current control element on the basis of a detection result of the current detecting circuit to prevent over-charging or over-discharging of the secondary battery:
        a constant voltage power supply for supplying a first supply voltage to the first control circuit; and
        a second control circuit for controlling the current detecting circuit and being driven by a second supply voltage lower than the first supply voltage;
        wherein the first control circuit is suspended in function when the first supply voltage falls below a predetermined level and the second control circuit deactivates the current detecting circuit when the first control circuits is suspended in operation.

4. A battery state monitoring circuit as set forth in claim 3; further comprising a supply voltage detecting circuit for detecting that the supply voltage output by the constant voltage supply has become lower than the predetermined level, and a power supply switch circuit for cutting off the power supply to the first control circuit when the supply voltage detecting circuit detects that the supply voltage has fallen below the predetermined level.

5. A battery state monitoring circuit as set forth in claim 3; wherein the first control circuit comprises a microcomputer; and further comprising a supply voltage detecting circuit for detecting that the supply voltage output by the constant voltage power supply has become lower than the predetermined level, and a reset circuit for outputting a reset signal to the microcomputer when the supply voltage detecting circuit detects lowering of the supply voltage below the predetermined level.

6. A battery state monitoring circuit according to claim 1; wherein the secondary battery comprises a plurality of secondary batteries connected in series.

7. A battery state monitoring circuit according to claim 1; wherein the predetermined voltage is a minimum power source voltage at which the microcomputer can operate stably.

8. A battery state monitoring circuit according to claim 1; wherein the microcomputer outputs a signal for turning off the amplifier when the regulated output voltage of the voltage regulator falls below the predetermined level.

9. A battery state monitoring circuit according to claim 1; wherein the control circuit turns off the voltage regulator when the regulated output voltage falls below the predetermined level.

10. A battery state monitoring circuit according to claim 1; wherein the control circuit is powered by the voltage of the secondary battery.

11. A battery state monitoring circuit according to claim 1; wherein the voltage detector comprises a reference voltage source for producing a voltage having the predetermined voltage level and a comparator for comparing the reference voltage and the regulated output voltage of the voltage regulator.

* * * * *